United States Patent
Cheng et al.

(10) Patent No.: US 10,655,019 B2
(45) Date of Patent: May 19, 2020

(54) PRIMING MATERIAL FOR SUBSTRATE COATING

(71) Applicant: Taiwan Semiconductor Manufacturing Company, Ltd., Hsin-Chu (TW)

(72) Inventors: Ya-Ling Cheng, Yilan (TW); Ching-Yu Chang, Hsin-Chu (TW)

(73) Assignee: TAIWAN SEMICONDUCTOR MANUFACTURING COMPANY, LTD., Hsin-Chu (TW)

(*) Notice: Subject to any disclaimer, the term of this patent is extended or adjusted under 35 U.S.C. 154(b) by 0 days.

(21) Appl. No.: 14/788,321

(22) Filed: Jun. 30, 2015

(65) Prior Publication Data

US 2017/0002208 A1    Jan. 5, 2017

(51) Int. Cl.

| | |
|---|---|
| *B05D 1/00* | (2006.01) |
| *C09D 5/00* | (2006.01) |
| *H01L 21/027* | (2006.01) |
| *H01L 21/67* | (2006.01) |
| *C09D 7/20* | (2018.01) |
| *G03F 7/16* | (2006.01) |
| *B05D 5/12* | (2006.01) |

(Continued)

(52) U.S. Cl.
CPC .............. *C09D 5/002* (2013.01); *C09D 7/20* (2018.01); *G03F 7/162* (2013.01); *H01L 21/0271* (2013.01); *H01L 21/6715* (2013.01); *B05D 1/002* (2013.01); *B05D 1/005* (2013.01); *B05D 3/02* (2013.01); *B05D 3/12* (2013.01); *B05D 5/12* (2013.01); *B05D 7/50* (2013.01)

(58) Field of Classification Search
CPC .......... B05D 1/002; B05D 1/005; B05D 3/02; B05D 3/12; B05D 5/12; B05D 7/50; H01L 21/02282; G03F 7/162
USPC ................. 427/97.1, 97.4, 98.6, 99.2, 240
See application file for complete search history.

(56) References Cited

U.S. PATENT DOCUMENTS 5,066,616 A * 11/1991 Gordon ............... G03F 7/162
148/DIG. 137
5,658,615 A * 8/1997 Hasebe ............... G03F 7/162
427/240

(Continued)

FOREIGN PATENT DOCUMENTS

TW         201701353 A       1/2017
WO    WO 2004/069945    *    8/2004

*Primary Examiner* — Brian K Talbot
(74) *Attorney, Agent, or Firm* — Haynes and Boone, LLP (57) ABSTRACT

A coating technique and a priming material are provided. In an exemplary embodiment, the coating technique includes receiving a substrate and applying a priming material to the substrate. The applying of the priming material may include rotating the substrate to disperse the priming material radially on the substrate. In the embodiment, the priming material includes a solvent with at least six carbon atoms per molecule. A film-forming material is applied to the substrate on the priming material, and the application includes rotating the substrate to disperse the film-forming material radially on the substrate. The priming material and the film-forming material are evaporated to leave a component of the film-forming material in a solid form. In various embodiments, the priming material is selected based on at least one of an evaporation rate, a viscosity, or an intermolecular force between the priming material and the film-forming material.

20 Claims, 5 Drawing Sheets

(51) Int. Cl.
    *B05D 7/00*      (2006.01)
    *B05D 3/02*      (2006.01)
    *B05D 3/12*      (2006.01)

(56) References Cited

U.S. PATENT DOCUMENTS

| | | | |
|---|---|---|---|
| 5,858,475 | A | 1/1999 | Chiu |
| 6,121,218 | A * | 9/2000 | Thompson ............. C11D 7/261 |
| | | | 510/176 |
| 6,147,010 | A * | 11/2000 | Whitman ............. H01L 21/312 |
| | | | 257/E21.259 |
| 6,326,319 | B1 * | 12/2001 | Pike ........................ G03F 7/16 |
| | | | 257/E21.259 |
| 6,736,896 | B2 | 5/2004 | Lin |
| 6,784,120 | B2 * | 8/2004 | Davlin ................. H01L 21/312 |
| | | | 257/E21.259 |
| 6,784,238 | B2 * | 8/2004 | Tokita ................... C08F 255/00 |
| | | | 523/201 |
| 6,869,640 | B2 * | 3/2005 | Yoshihara ............. B05D 1/005 |
| | | | 118/315 |
| 8,043,657 | B2 * | 10/2011 | Yoshihara ........... H01L 21/6715 |
| | | | 118/320 |
| 8,216,767 | B2 | 7/2012 | Wang et al. |
| 8,323,870 | B2 | 12/2012 | Lee et al. |
| 8,580,117 | B2 | 11/2013 | Kao et al. |
| 8,658,344 | B2 | 2/2014 | Wang et al. |
| 8,715,919 | B2 | 5/2014 | Chang et al. |
| 8,741,551 | B2 | 6/2014 | Wu et al. |
| 9,720,325 | B2 * | 8/2017 | Hsu ......................... G03F 7/162 |
| 2002/0127878 | A1 | 9/2002 | Young et al. |
| 2003/0101928 | A1 | 6/2003 | Chuang et al. |
| 2004/0076638 | A1 * | 4/2004 | Shiloach ................ C07K 14/32 |
| | | | 424/190.1 |
| 2010/0189888 | A1 * | 7/2010 | Mori ...................... B05D 1/005 |
| | | | 427/162 |
| 2010/0320618 | A1 * | 12/2010 | Ozaki ............... H01L 21/02167 |
| | | | 257/774 |
| 2013/0323641 | A1 | 12/2013 | Chang |
| 2014/0011133 | A1 | 1/2014 | Liu et al. |
| 2014/0017615 | A1 | 1/2014 | Chang |
| 2014/0017616 | A1 | 1/2014 | Chang |
| 2014/0065843 | A1 | 3/2014 | Chang et al. |
| 2014/0117563 | A1 | 5/2014 | Yu et al. |
| 2014/0120244 | A1 * | 5/2014 | Wang ................... C09D 165/00 |
| | | | 427/58 |
| 2014/0120459 | A1 | 5/2014 | Liu et al. |
| 2014/0186773 | A1 | 7/2014 | Chang |
| 2014/0255850 | A1 | 9/2014 | Chang et al. |
| 2014/0272704 | A1 | 9/2014 | Chang et al. |
| 2014/0272709 | A1 | 9/2014 | Liu et al. |
| 2014/0272726 | A1 | 9/2014 | Chang |
| 2014/0273521 | A1 | 9/2014 | Wu et al. |
| 2014/0367258 | A1 * | 12/2014 | Crane ................. G02B 26/005 |
| | | | 204/450 |
| 2015/0279662 | A1 * | 10/2015 | Zhang ............... H01L 21/02104 |
| | | | 427/58 |

* cited by examiner

PRIMING MATERIAL FOR SUBSTRATE COATING

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs, and, for these advances to be realized, similar developments in device fabrication are needed.

As merely one example, many fabrication steps involve the formation and manipulation of thin films of material formed on a substrate or wafer. Defects, imperfections, irregularities, and contaminants in these film layers may undermine the fabrication process and may precipitously affect both yield and device performance. Many of these types of defects compound as the films are layered upon each other during the fabrication process. Thus, the importance of uniformity and precise application cannot be overemphasized.

Spin coating is one technique for forming a thin layer of material on a substrate that has proved satisfactory in some applications. Spin coating may involve depositing a material in liquid form at the center of a substrate and spinning the substrate to drive the liquid to the edges. In this way, spin coating leverages the centrifugal tendencies of the liquid to produce a film of significantly uniform thickness.

However, while existing spin coating techniques have been generally adequate, the potential for future improvements still exists. For example, uniformity of the final film may still be improved. As another example, because many advanced fabrication processes rely on increasingly expensive materials, improved coverage using less liquid may meaningfully reduce cost per unit. For these reasons and others, additional improvements to spin coating techniques hold the potential to improve fabrication yield and to reduce cost and waste.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The present disclosure relates generally to IC device manufacturing and, more particularly, to an improved technique for spin coating that utilizes improved priming materials.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 1:
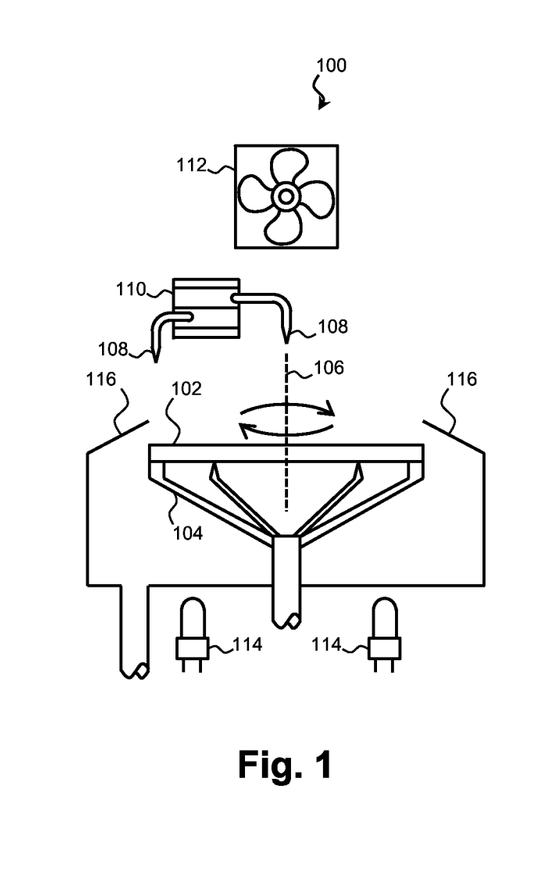
FIG. 1 is a side view of a spin coating system according to various aspects of the present disclosure.
Figure 2:
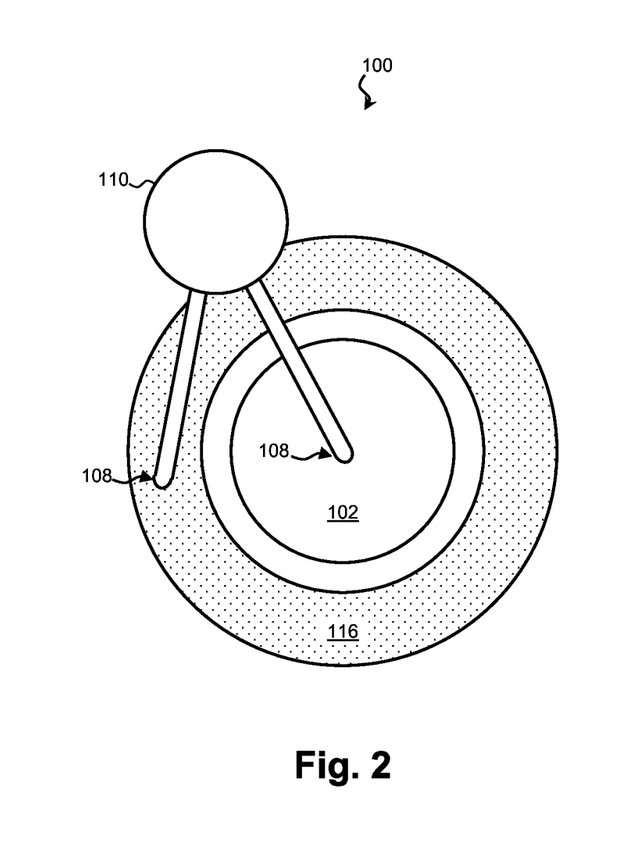
FIG. 2 is a top view of the spin coating system according to various aspects of the present disclosure.

The present disclosure relates to the application of a material to a work piece, such as a semiconductor substrate, using spin coating or similar techniques. An example of a spin coating system 100 suitable for performing this technique is described with reference to FIGS. 1 and 2. In that regard, FIG. 1 is a side view of a spin coating system 100 according to various aspects of the present disclosure, and FIG. 2 is a top view of the spin coating system 100 according to various aspects of the present disclosure. For clarity and ease of explanation, some elements of the figures have been simplified.

The spin coating system 100 utilizes the rotation of a substrate 102 to distribute a liquid across the surface. Accordingly, the system 100 may include a rotating chuck 104 operable to retain and rotate the substrate 102. The chuck 104 may use any method to retain the substrate 102, and in some exemplary embodiments, the chuck 104 is a vacuum chuck 104. Accordingly, in the illustrated embodiment, a central cavity within the chuck 104 is connected to a vacuum pump. The chuck 104 is sealed against a back surface of the substrate 102, and air within the cavity is evacuated to hold the substrate 102 in place.

Once the substrate 102 is secured, the chuck 104 rotates around a central axis 106 causing the retained substrate 102 to rotate as well. Rotational speeds may reach or exceed 3,000 rpm based on the application. Because of increased turbulence and rotational instability, maximum rotational speeds for larger wafers tend to be slower, and a typical maximum rotational speed for a 300 mm substrate 102 may be between about 800 rpm and about 4,000 rpm. The rotational speed of the chuck 104 (and by extension the substrate 102) may vary throughout the spin coating technique in order to control the dispersal of the liquid being applied.

To supply the liquid, spin coating system 100 may include one or more nozzles 108 and associated supply lines mounted on a movable armature 110. The movable armature 110 may relocate the nozzles to a "home" position out of the loading path during the loading of the substrate 102 and moves the nozzles into position over a central portion of the substrate 102 once the substrate 102 is secured. In some embodiments, the moveable armature also allows the nozzles 108 to be positioned anywhere along the radius of the substrate 102 during the spin coating process. In addition to liquid supply nozzles 108, the system 100 may include one or more gas delivery nozzles 108 on the armature 110 and aimed to direct air towards the substrate surface being coated. The gas delivery nozzles 108 may blow ambient air or one or more specified gasses such as nitrogen, argon, and/or helium on the substrate surface, and the movable armature 110 may sweep the nozzles 108 across the surface while the substrate is spinning and the gas is being supplied in order to drive the liquid outward. The air provided by the gas delivery nozzles 108 may be heated in order to control viscosity, thickness, evaporation, and/or solidification of the liquids provided on the substrate. For example, in some embodiments, air supplied by the gas delivery nozzles 108 is maintained at about 23° C. in order to keep the liquid viscous without over drying.

In addition to a gas delivery nozzle 108 or as an alternative thereto, the spin coating system 100 may include a downdraft air flow device 112 that directs air towards the surface of the substrate 102 upon which the film is being formed. Similar to the gas delivery nozzles 108, the air flow device 112 may blow ambient air or one or more specified gasses such as nitrogen, argon, and/or helium at the substrate surface. The air provided by the air flow device 112 may be heated in order to control viscosity, thickness, evaporation, and/or solidification of the liquids provided on the substrate. In that regard, some degree of evaporation during the application process may be desirable in order to produce thicker films, while over drying may prevent the liquid from fully covering the substrate 102 before solidifying.

To further control evaporation, the spin coating system 100 may include one or more heating elements 114 controlled to maintain the substrate and any liquids disposed thereupon at a designated temperature. In some examples, the heating elements 114 are controlled according to a complex thermal profile that varies the substrate 102 temperature throughout the spin coating process. In this manner, the heating elements 114 may be used to control viscosity, thickness, evaporation, and/or solidification of the liquids provided on the substrate.

As the substrate 102 rotates, some liquid deposited on the substrate may be ejected from the substrate 102. Much of the ejected liquid will come from the circumferential edge of the substrate 102, although some liquid will be ejected elsewhere along the surface of the substrate 102. To catch this liquid, the spin coating system 100 may include a coater cup 116 or dish surrounding the chuck 104 and the retained substrate 102. The cup 116 is shaped to catch the liquid and to prevent the ejected liquid from dripping or otherwise re-depositing on the substrate 102. Back-splattered liquids that re-deposit on a substrate 102 have been determined to cause spotting and other imperfections that may adversely impact yield. Depending on the degree of contamination, some of the captured liquid may be recycled and reused, although the liquid may also be captured for disposal.

Figure 3:
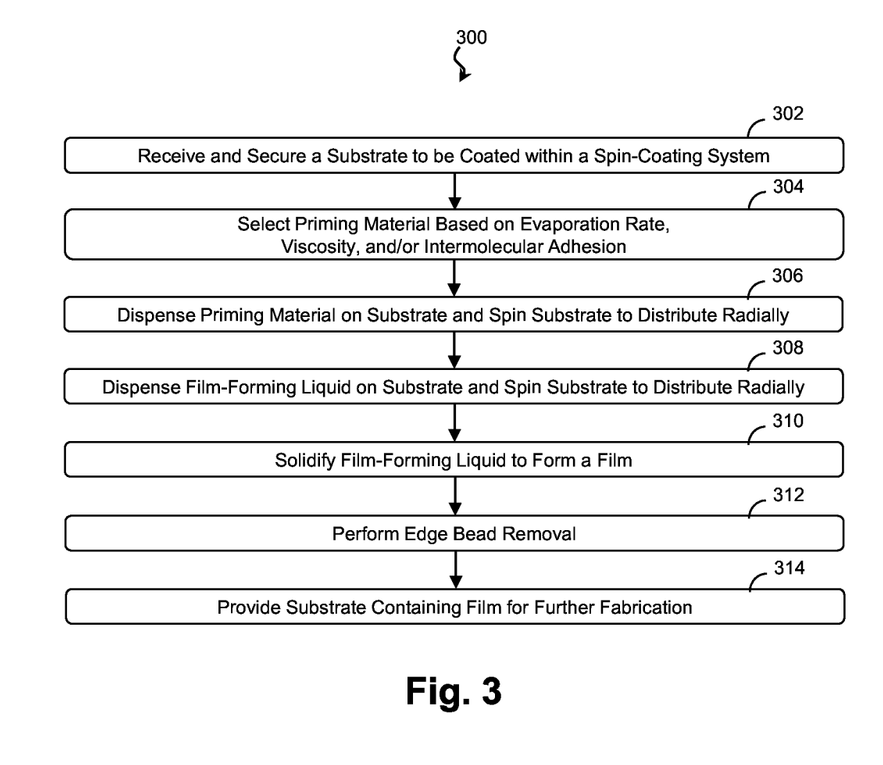
FIG. 3 is a flow diagram of a method for applying a film to a substrate according to various aspects of the present disclosure.

A technique for utilizing the spin coating system 100 that offers improved coverage with a reduced volume of liquid is described with reference to FIGS. 3-8. The technique is suitable for use in forming any of a wide variety of films upon a substrate 102, with exemplary films including photoresist films, antireflective coating films (e.g., a bottom antireflective coating (BARC) film), hard mask films, and/or other suitable films. As explained in more detail below, a priming material is first applied to the substrate to facilitate the subsequent application of a film-forming liquid by improving the flow and coverage of the film-forming liquid. The priming material may evaporate during the application and drying of the film-forming liquid, leaving only the film-forming liquid (in solid form) in a uniform layer of controlled thickness. FIG. 3 is a flow diagram of a method 300 for applying a film to a substrate 102 according to various aspects of the present disclosure. It is understood that additional steps can be provided before, during, and after the method 300 and that some of the steps described can be replaced or eliminated for other embodiments of the method 300. FIGS. 4-8 are side views of a spin coating system 100 performing the method 300 to apply a film to the substrate 102 according to various aspects of the present disclosure. The spin coating system 100 of FIGS. 4-8 may be substantially similar to that of FIG. 1 and may include a substrate 102, chuck 104, nozzles 108, and/or other elements substantially as described above. For clarity and ease of explanation, some elements of the figures have been simplified and some elements of the figures have been exaggerated.

Figure 4:
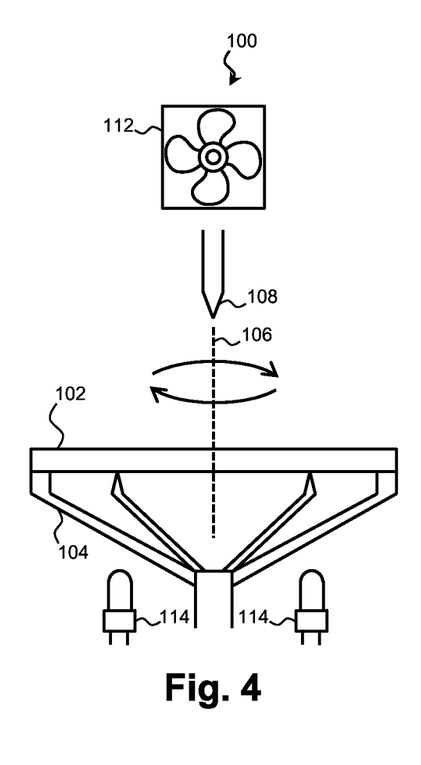
FIGS. 4-8 are side views of a spin coating system performing the method to apply a film to the substrate according to various aspects of the present disclosure.

Referring to block 302 of FIG. 3 and to FIG. 4, a substrate 102 is received and secured within a chuck 104 of the spin coating system 100. The substrate 102 is exemplary of any material upon which upon which other materials may be formed and may represent a semiconductor substrate for circuit fabrication, a mask substrate, and/or any other suitable substrate for any other suitable application. In various examples, the substrate 102 comprises an elementary (single element) semiconductor, such as germanium in a crystalline structure; a compound semiconductor, such as silicon germanium, silicon carbide, gallium arsenic, gallium phosmanium, indium phosphide, indium arsenide, and/or indium antimonide; a non-semiconductor material, such as sodalime glass, fused silica, fused quartz, and/or calcium fluoride ($CaF_2$); and/or combinations thereof. The substrate 102 may also include various material layers formed upon it. For example, the substrate 102 may include semiconductor layers, dielectric layers, conductive layers, and/or other material layers. In some such examples, the substrate 102 includes one or more dielectric materials such as a semiconductor oxide, a semiconductor nitride, a semiconductor oxynitride, and/or a semiconductor carbide.

Based in part on the processing steps that have been performed on the substrate 102, the substrate 102 may have a planar or substantially planar top surface upon which to apply the priming material and/or film forming liquids. However, spin coating is equally well suited to those examples where the substrate 102 has an irregular surface with features, protrusions, cavities, and other challenging topography. In such examples, liquid viscosity and other spin-coating parameters may be configured for optimal flow and gap-fill properties.

Referring to block 304 of FIG. 3, a priming material is selected. The selected priming material is applied to the substrate 102 before the film-forming liquid and may be selected to control the flow of the film-forming liquid during the spin coating process. It has been determined through investigation and experimentation that the evaporation rate of the priming material may affect the parameters used to apply the priming material (e.g., temperature, spin speed, spin time, etc.). For priming materials with higher evaporation rates, spin coating may entail higher rotational speeds in order to cover a substrate 102, particularly a larger substrate. However, it has also been determined that evaporation rates below a threshold, specifically, evaporation rates of less than or equal to about 0.55 times that of butyl acetate produce unexpectedly good flow and coverage of subsequent film-forming layers. Many priming materials including solvents within this range are able to cover a 300 nm wafer without dry spots produced by priming materials having greater evaporation rates. Many of these unexpectedly advantageous priming materials also have a viscosity less than a threshold, specifically less than or equal to about 3 cp at the temperature at which the priming material is to be applied. As described further below, these two factors, alone and in combination, provide clearly superior spin-coating performance.

It has further been determined that intermolecular forces between the priming material and the film-forming liquid may affect the suitability of the priming material. Specifically, molecular adhesion between the priming material and the film-forming liquid may inhibit the flow of the film material across the substrate 102. This may affect film thickness as well as the quality of the coverage. Thus, the priming material may also be selected based on having low intermolecular adhesion between the priming material and the film-forming liquid.

Based on a desired evaporation rate, viscosity, intermolecular adhesion, and/or other considerations, a priming material is selected. In some exemplary embodiment, the priming material includes a single solvent with or without one or more surfactants. Suitable solvents include hydrocarbons with at least one functional group such as a saturated, unsaturated, straight, branched, or cyclic alkyl, alkoxyl, fluoroalky, fluoroalkoxyl, carbonyl, hydroxyl, carboxylic, ester, ether, amide, amine, imine, imide, nitrate, nitrile, and/or thiol functional group. Suitable solvents may include six or more carbon atoms per molecule arranged in a carbon chain or in a carbon ring with or without a carbon chain bonded to the carbon ring. Chain-containing solvents may contain an uninterrupted carbon chain or a chain that includes other elements such as oxygen in the case of amyl acetate. In such single-solvent embodiments, the solvent may be selected to have a relative evaporation rate (compared to n-butyl acetate (nBA)) of less than or equal to about 0.55 times that of n-butyl acetate and selected such that the overall priming material has a viscosity less than or equal to about 3 cp at 25° C. In one such embodiment, the solvent is decane, and in other such embodiments, the solvent is amyl acetate, iso-amyl acetate, cyclohexanone (CHN), 2-heptanone, a.k.a. methyl n-amyl ketone (MAK), or gamma-butyrolactone (GBL).

In some exemplary embodiments, the priming material includes two or more solvents with or without one or more surfactants. The use of multiple solvents allows different solvents to achieve different targets (e.g., evaporation rate, viscosity, and/or intermolecular force targets as well as other material considerations). Suitable solvents for each of the constituent solvents include hydrocarbons with at least one functional group such as a saturated, unsaturated, straight, branched, or cyclic alkyl, alkoxyl, fluoroalky, fluoroalkoxyl, carbonyl, hydroxyl, carboxylic, ester, ether, amide, amine, imine, imide, nitrate, nitrile, and/or thiol functional group.

In some embodiments, the priming material includes a first solvent to achieve a target evaporation rate and a second solvent to achieve an intermolecular force target. The first one of the solvents has a long chain hydrocarbon to control the evaporation rate. For example, the first solvent may include six or more carbon atoms arranged in a carbon chain or in a carbon ring with or without a carbon chain. Chain-containing solvents may contain an uninterrupted carbon chain or a chain that includes other elements such as oxygen in the case of amyl acetate. As a result of the molecular weight, the first solvent may have a relative evaporation rate that is less than or equal to about 0.55 times that of n-butyl acetate. Suitable solvents for the first solvent include propylene glycol methyl ether acetate (PGMEA), propylene glycol monomethyl ether (PGME), gamma-butyrolactone (GBL), ethyl lactate (EL), cyclohexanone (CHN), cyclopentanone, ethyl 3-ethoxypropionate (EEP), methyl n-amyl ketone (MAK), decane, amyl acetate, and/or iso-amyl acetate.

The second solvent of the priming material may be selected to have at least one hydrogen-bond donor group or hydrogen-bond acceptor group to match the hydrogen affinity (e.g., hydrophobic, hydrophilic, etc.) of the subsequently deposited film material. In some embodiments, the second solvent is selected because it forms a dimer in combination with the first solvent. Suitable solvents for the second solvent include propylene glycol methyl ether (PGME), propylene glycol ethyl ether (PGEE), PGMEA, n-butyl acetate (nBA), methyl isobutyl carbinol (MIBC), methyl isobutyl ketone (MIBK), MAK, isopropyl alcohol, decane, amyl acetate, iso-amyl acetate, CHN, and/or GBL. As some of the solvents are suitable for use as both a first solvent and/or a second solvent (e.g., PGMEA, PGME, decane, amyl acetate, iso-amyl acetate, CHN, and GBL), in various embodiments, the priming material includes these solvents as a first solvent exclusively, a second solvent exclusively, or both the first and second solvents. The first, second, and any remaining solvents of the priming material may be selected such that the overall priming material has a viscosity less than or equal to about 3 cp at 25° C. In one exemplary embodiment, the priming material includes about 60% amyl acetate and about 40% PGMEA. In another embodiment, the priming material includes 60% PGMEA and 40% CHN.

Figure 5:
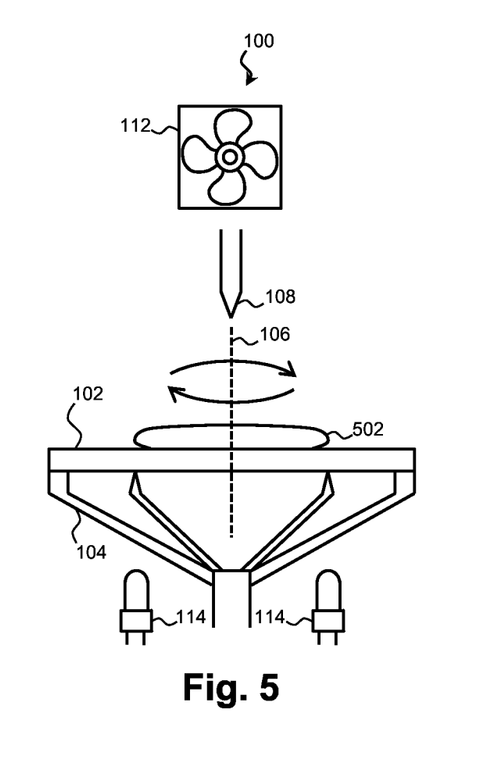

Referring to block 306 of FIG. 3 and to FIG. 5, the selected priming material 502 is dispensed on a central portion of the substrate 102. In some embodiments, a nozzle 108 is moved from a home position suitable for loading the substrate 102 to a position directly over the center of the substrate 102, and the priming material 502 is dispensed on the substrate 102 through the nozzle 108. The chuck 104 may begin rotating the substrate 102 at any time before, during, and/or after the dispensing of the priming material 502. In an exemplary embodiment, the substrate 102 remains stationary during an initial portion of the dispensing until a first portion of the priming material 502 has been dispensed, and the chuck 104 begins to rotate the substrate 102 after the first portion of the priming material 502 has been dispensed. In the example, the nozzle 108 continues to dispense a remaining portion of the priming material 502 while the substrate 102 spins. Centrifugal tendencies caused by the rotation of the substrate 102 cause the priming material 502 to be drawn from the center to the perimeter of substrate 102.

Dispensing the priming material 502 may include applying heat and/or gasses to the substrate 102 to control dispersal and evaporation of the priming material 502. For example, a nozzle 108 attached to the armature 110 or the downdraft air flow device 112 may provide an inert gas such as nitrogen, helium, or argon on the substrate surface to help distribute the priming material 502. Furthermore, at any time before, during, and/or after the dispensing of the priming material 502, a heating element 114 of the spin coating system 100 may apply heat to the substrate 102 to control primer viscosity, evaporation, and/or other aspects of the spin coating process. These mechanisms and others are used to achieve good coverage of the substrate 102 without overly drying the priming material 502 before the film-forming liquid is applied. Particular attention may be paid to the coverage of the priming material 502 at the substrate perimeter where the priming material 502 may be thinnest.

Figure 6:
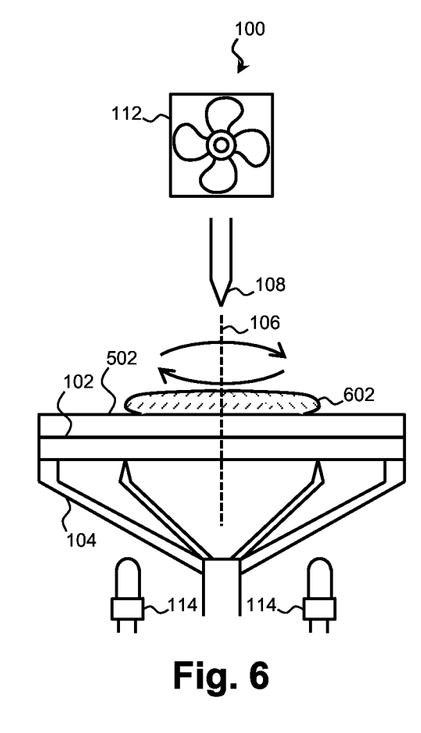

Referring to block 308 of FIG. 3 and to FIG. 6, the film-forming liquid 602 is dispensed on the central portion of the substrate 102. The film-forming liquid 602 may be dispensed by the same nozzle as the priming material 502 or a different nozzle 108 may be used. The chuck 104 may rotate the substrate 102 at any time before, during, and/or after the dispensing of the film-forming liquid 602. In an exemplary embodiment, the substrate 102 remains stationary until a first portion of the film-forming liquid 602 has been dispensed, and begins to rotate the substrate 102 while the nozzle 108 continues to dispense a remaining portion of the film-forming liquid 602. The remaining portion may be dispensed while the substrate is rotated. The rotation of the substrate 102 causes the film-forming liquid 602 to be driven from the center to the perimeter of substrate 102.

Similar to the priming material 502, dispensing the film-forming liquid 602 may include applying heat and/or gasses to the substrate 102 to control dispersal and evaporation of the film-forming liquid 602. For example, a nozzle 108 or downdraft air flow device 112 may supply an inert gas such as nitrogen to distribute the film-forming liquid 602 across the substrate 102. Likewise, at any time before, during, and/or after the dispensing of the priming material, a heating element 114 of the spin coating system 100 may apply heat to the substrate 102 to control the evaporation of the film-forming liquid 602. These mechanisms and others are used to achieve good coverage of the substrate 102 particularly at the perimeter where the film-forming liquid 602 may be thinnest.

By using a priming material 502, the film-forming liquid 602 may disperse across the surface of the substrate 102 more evenly. Specifically, a priming material 502 with an optimal evaporation rate remains on the substrate 102 during the application of the film-forming liquid 602 to facilitate even dispersal. Likewise, a priming material 502 with a low molecular attraction to the film-forming liquid 602 also promotes dispersal of the film-forming liquid 602. As a result, the material remaining after the film-forming liquid 602 dries may have a more consistent thickness with few or no dry spots where the substrate 102 lacks any film material. Moreover, the use of a priming material 502 may greatly reduce the amount of film-forming liquid 602 used to coat the substrate. In one exemplary test, one cubic centimeter (1 cm$^3$) of a photoresist film-forming liquid 602 applied over a priming material 502 as described herein was used to cover a substrate 102 to a desired thickness without dry spots. In contrast, more than five cubic centimeters (5 cm$^3$) of the same film-forming liquid 602 was needed to produce the same degree of coverage without the priming material. Because the priming material 502 is cheap by comparison, the cost saving may be substantial. Of course, these advantages are merely exemplary, and no advantage is characteristic of or required for any particular embodiment.

Figure 7:
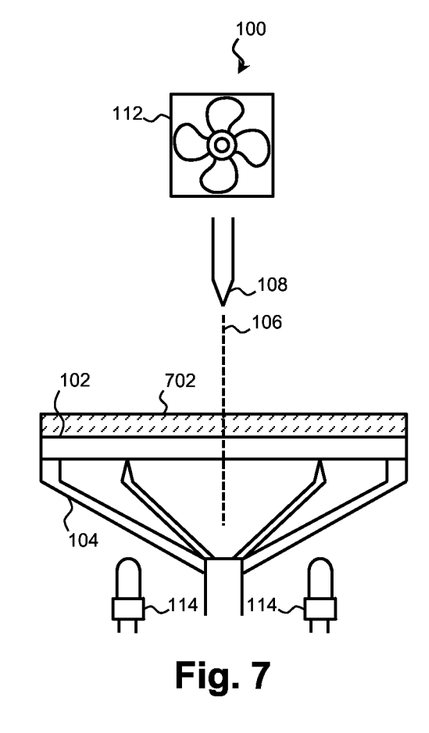

Referring to block 310 of FIG. 3 and to FIG. 7, the film-forming liquid 602 is solidified by evaporating a solvent within the film-forming liquid 602 and evaporating any remaining portion of the priming material 502. Solidification leaves behind a component of the film-forming liquid 602 as a material film 702 (e.g., a photoresist film, an antireflective coating film, a hard mask film, etc.) of a desired thickness. Evaporation and solidification may occur during the dispersal and spinning processes and block 308 and may continue during a post-spin phase. During the post-spin phase, heat and/or gasses may be applied to the substrate 102 to control evaporation. For example, a gas delivery nozzle 108 or a downdraft air flow device 112 may provide ambient air and/or an inert gas such as nitrogen, helium, or argon on the substrate surface. The supplied gas may be heated to a designated temperature, which may vary throughout the process. Similarly, a heating element 114 of the spin coating system 100 may apply heat to the substrate 102 to control substrate temperature.

Figure 8:
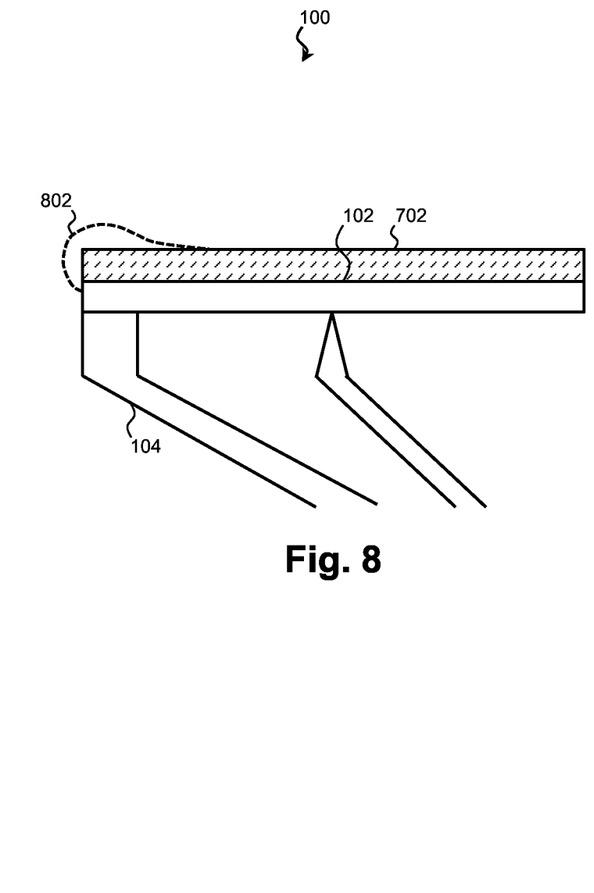

Referring to block 312 of FIG. 3 and to FIG. 8, an edge bead removal process may be performed on the film 702. While the film 702 tends to be thinner towards the perimeter of the substrate 102, at the extreme edge, surface tension and viscosity of the film-forming liquid 602 may create a bulge or bead 802 at the edge of the substrate 102. The edge bead may be removed by applying a solvent or an acid to the film 702 while the substrate 102 is spun. Additionally on in the alternative, a photosensitive film 702 may undergo an optical bead removal where the bead 802 is exposed to lithographic energy. Because it has been exposed, the bead 802 will be removed when the photosensitive film 702 is developed.

Referring to block 314 of FIG. 3, the substrate 102 containing the film 702 is provided for further fabrication. In the case of a photoresist film 702, further fabrication may include a lithographic exposure. An exemplary photolithographic patterning process includes soft baking of the photoresist film 702, mask aligning, exposure (e.g., KrF, ArF, ArF immersion, EUV, EB, and/or X-ray exposure), post-exposure baking, developing the film 702, rinsing, and drying (e.g., hard baking). In the case of an anti-reflective coating film 702 or a hard mask film 702, further fabrication may include any suitable etching process, deposition process, implantation process, epitaxy process, and/or any other fabrication process to be performed on the film 702. In various examples, the film 702 is used to fabricate a gate stack, to fabricate an interconnect structure, to form non-planar devices by etching to expose a fin or by epitaxially growing fin material, and/or other suitable applications. For example, in that regard, the substrate 102 and the film 702 may be used to fabricate an integrated circuit chip, a system on a chip (SOC), and/or a portion thereof, and thus the subsequent fabrication processes may form various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, other types of transistors, and/or other circuit elements.

Thus, the present disclosure provides a spin-coating technique and a priming material for forming thin films that offers superior coverage with reduced fluid utilization. In some embodiments, the provided method includes receiving a substrate having a top surface for coating (which may be substantially planar or irregular) and applying a priming material to the top surface that includes a solvent with at least six carbon atoms per molecule to the substrate. The applying of the priming material includes rotating the substrate to disperse the priming material radially on the substrate. A film-forming material is applied to the substrate on the priming material, and the applying of the film-forming material includes rotating the substrate to disperse the film-forming material radially on the substrate. The priming material and the film-forming material are evaporated to leave a component of the film-forming material in a solid form. In some such embodiments, the priming material includes at least two solvents, wherein different solvents of the at least two solvents are selected to achieve at least two different targets of an evaporation rate target, a viscosity target, or an intermolecular force target.

In further embodiments, the method comprises performing a first spin-coating process to apply a primer to a flat or a topographically complex surface of circuit substrate. The primer includes a solvent selected based on at least one of an evaporation rate of the primer, a viscosity of the primer, or an intermolecular force between the primer and a film-forming material. Thereafter, a second spin-coating process is performed to apply the film-forming material to the circuit substrate. In some such embodiments, the priming material has an evaporation rate of less than or equal to about 0.55 times that of butyl acetate, and in some such embodiments, the priming material has one of a hydrogen-bond donor group or a hydrogen-bond acceptor group based on a hydrogen affinity of the film-forming material.

In yet further embodiments, a spin-coating primer is provided. The spin-coating primer includes a solvent with at least six carbon atoms per molecule. In some such embodiments, the solvent includes at least one of: propylene glycol methyl ether acetate (PGMEA), propylene glycol monomethyl ether (PGME), gamma-butyrolactone (GBL), ethyl lactate (EL), cyclohexanone (CHN), cyclopentanone, ethyl 3-ethoxypropionate (EEP), methyl n-amyl ketone (MAK), decane, amyl acetate, and/or iso-amyl acetate. In some such embodiments, the spin-coating primer further includes a second solvent different from the first solvent and that includes at least one of: propylene glycol methyl ether (PGME), propylene glycol ethyl ether (PGEE), PGMEA, n-butyl acetate (nBA), methyl isobutyl carbinol (MIBC), methyl isobutyl ketone (MIBK), MAK, isopropyl alcohol, decane, amyl acetate, iso-amyl acetate, CHN, and/or GBL.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of film formation for an integrated circuit device, the method comprising:
   receiving a substrate;
   selecting a first solvent and a second solvent to form a priming material, wherein the first solvent is methyl n-amyl ketone (MAK), and wherein selecting the second solvent includes selecting a solvent configured to form a dimer with the first solvent and to match a hydrogen affinity of a film-forming material;
   dispensing the selected priming material over the substrate;
   spreading the priming material fully across a top surface of the substrate;
   dispensing the film-forming material to the substrate over the priming material;
   spreading the film-forming material fully across a top surface of the priming material such that, a bottom surface of the film-forming material remains above a top surface of the priming material during the spreading, and the priming material remains underneath the film-forming material after the spreading;
   evaporating the priming material, wherein the priming material is evaporated from underneath the film-forming material; and
   treating the film-forming material to form a photoresist.

2. The method of claim 1, wherein the dispensing of the selected priming material includes rotating the substrate to disperse the priming material radially on the substrate, and wherein the applying of the film-forming material includes rotating the substrate to disperse the film-forming material radially on the priming material.

3. The method of claim 1, wherein the selecting of the first solvent and the second solvent achieves at least two different targets of an evaporation rate target, a viscosity target, or an intermolecular force target.

4. The method of claim 3, wherein the second solvent is methyl isobutyl ketone (MIBK).

5. The method of claim 3, wherein the second solvent includes one of: a hydrogen-bond donor group or a hydrogen-bond acceptor group.

6. The method of claim 1, wherein the priming material has an evaporation rate target of less than or equal to about 0.55 times that of n-butyl acetate (nBA).

7. The method of claim 1, wherein the priming material has a viscosity target of less than or equal to about 3 cp at 25° C.

8. A method of photoresist coating, comprising:
   providing a substrate with a coating primer including at least a first solvent and a second solvent, wherein the first solvent has an evaporation rate of less than or equal to about 0.55 times that of n-butyl acetate (nBA) and the second solvent has at least one hydrogen-bond donor group or hydrogen-bond acceptor group, wherein the coating primer has a viscosity less than or equal to about 3 cp at 25° C., and wherein the first solvent and the second solvent form a dimer therebetween;
   extending the coating primer across a top surface of the substrate; and
   forming a photoresist layer over the substrate, wherein the forming includes:
      dispersing a photoresist-forming material fully across a top surface of the coating primer such that, a bottom surface of the photoresist-forming material remains above a top surface of the coating primer during the dispersing, and the coating primer remains underneath the photoresist-forming material after the dispersing of the photoresist-forming material, wherein the coating primer is selected to have a low molecular attraction to the photoresist-forming material;
      evaporating a portion of the coating primer from underneath the photoresist-forming material; and
      subsequent to evaporating the portion of the coating primer, evaporating a portion of the photoresist-forming material to form the photoresist layer, wherein the evaporating of the portion of the photoresist-forming material removes a remaining portion of the coating primer.

9. The method of claim 8, wherein the first solvent includes methyl n-amyl ketone (MAK), and wherein the second solvent includes methyl isobutyl ketone (MIBK).

10. The method of claim 8, wherein the providing of the substrate includes rotating the substrate to disperse the coating primer radially on the substrate.

11. The method of claim 8, wherein the forming of the photoresist layer further comprises: evaporating the coating primer from underneath the photoresist-forming material.

12. The method according to claim 8, wherein the dispersing of the photoresist-forming material includes rotating the substrate to disperse the photoresist-forming material radially over the top surface of the coating primer.

13. The method of claim 9, wherein the first solvent further includes at least one of: decane, propylene glycol monomethyl ether (PGME), amyl acetate, or iso-amyl acetate.

14. A method of forming a photoresist on an integrated circuit device, the method comprising:
receiving a substrate;
selecting a first solvent and a second solvent to form a priming material, wherein the first solvent is methyl n-amyl ketone (MAK), and wherein selecting the second solvent includes selecting a solvent configured to form a dimer with the first solvent and to match a hydrogen affinity of a photoresist-forming material;
applying the selected priming material to the substrate such that the priming material fully extends across a top surface of the substrate;
dispensing the photoresist-forming material over the priming material;
dispersing the photoresist-forming material across a top surface of the priming material such that, during the dispersing, a bottom surface of an edge of the photoresist-forming material remains over a top surface of an edge of the priming material and, after the dispersing, the priming material remains under the photoresist-forming material;
evaporating a portion of the priming material from underneath the photoresist-forming material; and
evaporating a component of the photoresist-forming material to form a photoresist film over the substrate, wherein the evaporating of the component of the photoresist-forming material removes a remaining portion of the priming material.

15. The method of claim 14, wherein the selecting of the first solvent and the second solvent achieves at least two different targets selected from an evaporation rate target, a viscosity target, and an intermolecular force target.

16. The method of claim 15, wherein the second solvent is selected from methyl isobutyl ketone (MIBK), decane, propylene glycol monomethyl ether (PGME), amyl acetate, and iso-amyl acetate.

17. The method of claim 16, wherein the second solvent is MIBK.

18. The method of claim 14, wherein the applying of the priming material includes rotating the substrate to disperse the priming material radially on the substrate, and wherein the applying of the photoresist-forming material includes rotating the substrate to disperse the photoresist-forming material radially on the priming material.

19. The method of claim 14, wherein the priming material has an evaporation rate target of less than or equal to about 0.55 times that of n-butyl acetate (nBA) and a viscosity target of less than or equal to about 3 cp at 25° C.

20. The method of claim 14, wherein the second solvent includes one of: a hydrogen-bond donor group or a hydrogen-bond acceptor group.

* * * * *